United States Patent
Suzuki et al.

(10) Patent No.: US 9,331,150 B2
(45) Date of Patent: May 3, 2016

(54) SEMICONDUCTOR DEVICE AND METHOD OF MANUFACTURING THE SAME

(71) Applicant: Kabushiki Kaisha Toshiba, Minato-ku (JP)

(72) Inventors: Mariko Suzuki, Yokohama (JP); Tadashi Sakai, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/619,565

(22) Filed: Feb. 11, 2015

(65) Prior Publication Data

US 2015/0236097 A1    Aug. 20, 2015

(30) Foreign Application Priority Data

Feb. 17, 2014  (JP) .................................. 2014-027936

(51) Int. Cl.
*H01L 29/15*   (2006.01)
*H01L 29/16*   (2006.01)
(Continued)

(52) U.S. Cl.
CPC ............ *H01L 29/1602* (2013.01); *H01L 29/47* (2013.01); *H01L 29/6603* (2013.01); *H01L 29/872* (2013.01)

(58) Field of Classification Search
CPC ............... H01L 21/02115; H01L 2021/28543; H01L 21/3146; H01L 23/3732; H01L 28/22; H01L 29/1602; H01L 29/66015
See application file for complete search history.

(56) References Cited

U.S. PATENT DOCUMENTS 7,851,881 B1 * 12/2010 Zhao .................. H01L 21/0495
                                                              257/155
2003/0020133 A1   1/2003 Dahlqvist et al.
(Continued)

FOREIGN PATENT DOCUMENTS

JP    2004-528728    9/2004
JP    2009-44570     2/2009
(Continued)

OTHER PUBLICATIONS

U.S. Appl. No. 14/473,158, filed Aug. 29, 2014, Mariko Suzuki, et al.
(Continued)

*Primary Examiner* — David Vu
*Assistant Examiner* — Samuel Park
(74) *Attorney, Agent, or Firm* — Oblon, McClelland, Maier & Neustadt, L.L.P.

(57) ABSTRACT

A semiconductor device of an embodiment includes a p-type first diamond semiconductor layer, a p-type second diamond semiconductor layer disposed on the first diamond semiconductor layer, a plurality of n-type third diamond semiconductor layers disposed on the second diamond semiconductor layer, and a first electrode disposed on the second diamond semiconductor and the third diamond semiconductor layers. The p-type second diamond semiconductor layer has a p-type impurity concentration lower than a p-type impurity concentration of the first diamond semiconductor layer and has oxygen-terminated surfaces. Each of the third diamond semiconductor layers has an oxygen-terminated surface. The first electrode forms first junctions between the first electrode and the second diamond semiconductor. The first electrode forms second junctions between the first electrode and the third diamond semiconductor layers. The first junctions and the second junctions are Schottky junctions.

10 Claims, 3 Drawing Sheets

(51) Int. Cl.
*H01L 29/47* (2006.01)
*H01L 29/66* (2006.01)
*H01L 29/872* (2006.01)

(56) References Cited

U.S. PATENT DOCUMENTS

| | | |
|---|---|---|
| 2007/0278609 A1 | 12/2007 | Harris et al. |
| 2009/0050899 A1 | 2/2009 | Ikeda et al. |
| 2009/0224354 A1* | 9/2009 | Konstantinov ........ H01L 29/872 257/475 |
| 2010/0117098 A1* | 5/2010 | Ikeda ........................ C22C 5/04 257/77 |
| 2011/0017991 A1 | 1/2011 | Tanimoto et al. |
| 2014/0287570 A1* | 9/2014 | Edwards ................ H01L 29/47 438/478 |
| 2015/0060885 A1 | 3/2015 | Suzuki et al. |

FOREIGN PATENT DOCUMENTS

| | | |
|---|---|---|
| JP | 2009-54641 | 3/2009 |
| JP | 2009-260278 | 11/2009 |
| JP | 2010-50468 | 3/2010 |
| JP | 2013-89723 | 5/2013 |
| JP | 2015-50393 A | 3/2015 |
| WO | WO 02/099869 A1 | 12/2002 |
| WO | WO 2007/139487 A1 | 12/2007 |

OTHER PUBLICATIONS

Toshiharu Makino, et al., "Diamond Schottky-*pn* diode with high forward current density and fast switching operation", Applied Physics Letters, vol. 94, 2009, 3 pages.

Hitoshi Umezawa, et al., "High temperature application of diamond power device", Diamond & Related Materials, vol. 24, 2012, pp. 201-205.

Extended European Search Report issued Jul. 9, 2015 in Patent Application No. 15153086.2.

P. K. Baumann et al., "Electron Affinity and Schottky Barrier Height of Metal-diamond (100), (111), and (110) Interfaces", Journal of Applied Physics, vol. 83, No. 4, XP-012044685, Feb. 15, 1998, pp. 2072-2082.

Shozo Kono et al., "Electron Spectroscopic Determination of Electronic Structures of Phosphorus-Doped n-Type Heteroepitaxial Diamond (001) Surface and Junction", Japanese Journal of Applied Physics, vol. 51, XP-55197289, Aug. 7, 2012, 11 pages.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-027936, filed on Feb. 17, 2014, the entire contents of which are incorporated herein by reference.

FIELD

Embodiments described herein relate generally to a semiconductor device and a method of manufacturing the same.

BACKGROUND

A diamond semiconductor is a wide gap semiconductor having a large band gap energy of 5.5 eV. The diamond semiconductor is not only firm and has high thermal conductivity (20 W/cm·K), but also has excellent material properties, such as high carrier mobility (electron mobility of 4500 $cm^2$/V·sec, hole mobility of 3800 $cm^2$/v·sec) and high breakdown field intensity (10 MV/cm). Accordingly, the diamond semiconductor is a material having excellent properties as a semiconductor with ultrahigh breakdown voltage and ultrahigh efficiency.

To date, a diode, a transistor, or the like using the diamond semiconductor and having a Schottky junction has been actively developed.

DETAILED DESCRIPTION

A semiconductor device according to an embodiment includes: a p-type first diamond semiconductor layer; a p-type second diamond semiconductor layer disposed on the first diamond semiconductor layer, the p-type second diamond semiconductor layer having a p-type impurity concentration lower than a p-type impurity concentration of the first diamond semiconductor layer and having oxygen-terminated surfaces; a plurality of n-type third diamond semiconductor layers disposed on the second diamond semiconductor layer, each having an oxygen-terminated surface; and a first electrode disposed on the second diamond semiconductor and the third diamond semiconductor layers, the first electrode forming first junctions between the first electrode and the second diamond semiconductor, the first electrode forming second junctions between the first electrode and the third diamond semiconductor layers, the first junctions and the second junctions being Schottky junctions.

Embodiments will be described below by using the accompanying drawings.

In the following description, notations of n+, n, n− and p+, p, p− indicate relative levels of impurity concentration in each conductivity type. In other words, it shows that an n-type impurity concentration of n+ is relatively higher than that of n, and that an n-type impurity concentration of n− is relatively lower than that of n. Further, it shows that a p-type impurity concentration of p+ is relatively higher than that of p, and that a p-type impurity concentration of p− is relatively lower than that of p. It should be noted that there is also a case where n+-type and n−-type are simply described as "n-type" and p+-type and p−-type are simply described as "p-type".

Further, the embodiments described below can be implemented in directions different from the directions illustrated or described below.

First Embodiment

A semiconductor device according to the present embodiment includes: a p-type first diamond semiconductor layer; a p-type second diamond semiconductor layer disposed on the first diamond semiconductor layer, the p-type second diamond semiconductor layer having a p-type impurity concentration lower than a p-type impurity concentration of the first diamond semiconductor layer and having oxygen-terminated surfaces; a plurality of n-type third diamond semiconductor layers disposed on the second diamond semiconductor layer, each having an oxygen-terminated surface; and a first electrode disposed on the second diamond semiconductor and the third diamond semiconductor layers, the first electrode forming first junctions between the first electrode and the second diamond semiconductor, the first electrode forming second junctions between the first electrode and the third diamond semiconductor layers, the first junctions and the second junctions being Schottky junctions.

Figure 1A:
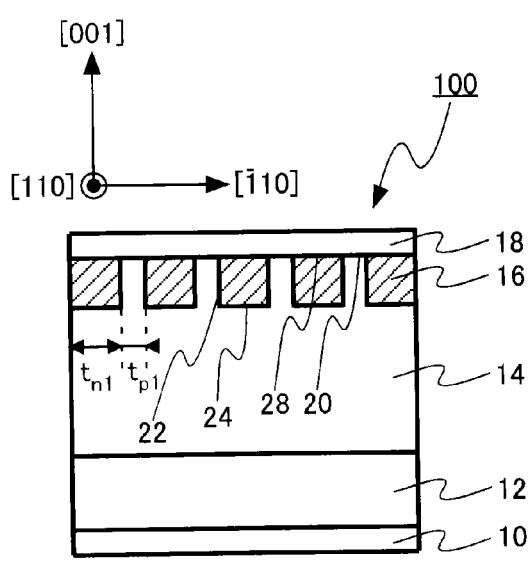
FIGS. 1A and 1B are schematic cross-sectional views of a semiconductor device of a first embodiment.
Figure 1B:
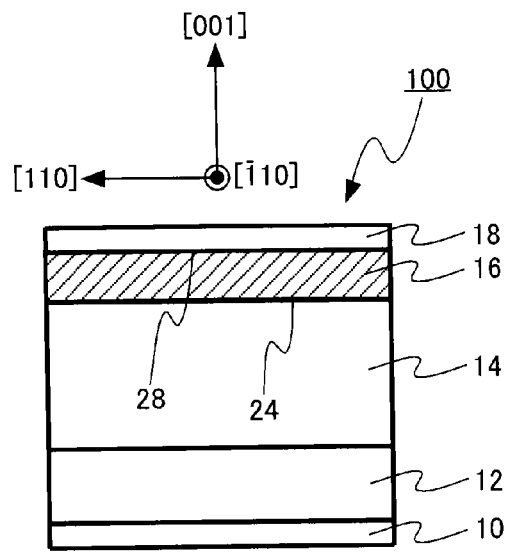

FIGS. 1A and 1B are schematic cross-sectional views of a semiconductor device 100 of the present embodiment. The semiconductor device 100 of the present embodiment is a Schottky diode.

A conductivity type of a first diamond semiconductor layer 12 is a p+-type. For example, boron (B) is preferably used as a p-type impurity. To inject a lot of holes into a second diamond semiconductor layer 14, it is preferable that a p-type impurity concentration in the p-type first diamond semiconductor layer 12 be, for example, $10^{18}$ atoms/$cm^3$ or more.

A conductivity type of the second diamond semiconductor layer 14 is a p−-type. The p-type second diamond semiconductor layer 14 is a drift layer. For example, boron (B) is preferably used as a p-type impurity. To increase breakdown voltage, it is preferable that a p-type impurity concentration in the p-type second diamond semiconductor layer 14 be $1\times10^{15}$ atoms/$cm^3$ or more and $5\times10^{16}$ atoms/$cm^3$ or less.

A conductivity type of a plurality of third diamond semiconductor layers 16 is an n-type. For example, phosphorus (P) is preferably used as an n-type impurity. To increase breakdown voltage, it is preferable that an n-type impurity concentration in the n-type third diamond semiconductor layers 16 be $1\times10^{15}$ atoms/$cm^3$ or more and $5\times10^{18}$ atoms/$cm^3$ or less. Further, the third diamond semiconductor layers 16 are depleted due to application of a forward bias.

To increase the breakdown voltage and from viewpoints of reducing on-resistance and accelerating switching speed, it is preferable that a width $t_{p1}$ of the p-type second diamond semiconductor layer 14 and a width $t_{n1}$ of the n-type third diamond semiconductor layer 16 be within a range from 0.5 µm to 10 µm, and it is preferable that an embedding depth of the n-type third diamond semiconductor layer 16 be within a range from 0.3 µm to 1 µm. In a case of a voltage resistant 5 kV class diode, it is preferable that $t_{p1}$ and $t_{n1}$ be, for example, 4 µm and 2 µm, respectively. Further, it is preferable that the embedding depth of the n-type third diamond semiconductor layer 16 be 0.5 µm.

It is preferable that a surface 20 of the p-type second diamond semiconductor layer has a plane orientation within ±10 degrees from a {100} plane. Further, it is preferable that side surfaces 22 of the n-type third diamond semiconductor layers have plane orientations within ±10 degrees from a {110} plane.

A first electrode 18 is a cathode (negative pole) of the Schottky diode. First junctions between the first electrode 18 and the p-type second diamond semiconductor layer 14 are Schottky junctions. Second junctions between the first electrode 18 and the third diamond semiconductor layer 16 are the Schottky junctions. It is preferable that the first electrode 18 include at least one kind of metals selected from a first group comprising nickel (Ni), aluminum (Al), titanium (Ti), molybdenum (Mo), ruthenium (Ru), tungsten carbide (WC), gold (Au), palladium (Pd), iridium (Ir), platinum (Pt), and rhodium (Rh).

The surfaces 20 of the p-type second diamond semiconductor layer and surfaces 28 of the n-type third diamond semiconductor layers, both of which are in contact with the first electrode 18, are oxygen-terminated. For example, whether the surfaces 20 of the second diamond semiconductor layer and the surfaces 28 of the third diamond semiconductor layers are oxygen-terminated is analyzed by an energy dispersive X-ray spectroscopy (EDX).

Here, the EDX can be preferably carried out by observing a cross section of the semiconductor device 100 of the present embodiment with a microscope, such as a transmission electron microscope (TEM) or a scanning electron microscope (SEM) and by using an EDX device attached to the TEM or the SEM.

Spatial resolution of the analysis by the EDX device is generally about 5 nm. Accordingly, even if oxygen is not necessarily detected on the surface, as long as oxygen (O) is detected at a measured lower limit value or more of the EDX device within a range of 5 nm from an interface where the p-type second diamond semiconductor layer 14 and the n-type third diamond semiconductor layers 16 are in contact with the first electrode 18, the surfaces 20 of the p-type second diamond semiconductor layer and the surfaces 28 of the n-type third diamond semiconductor layers are regarded as oxygen-terminated.

The semiconductor device 100 of the present embodiment can further preferably include a second electrode 10 electrically connected to the first diamond semiconductor layer 12. The second electrode 10 is a positive electrode (anode) of the Schottky diode. As illustrated in FIGS. 1A and 1B, the second electrode 10 is disposed, for example, on a surface of the first diamond semiconductor layer 12 on a side opposite to a surface, on which the second diamond semiconductor layer 14 is disposed. It should be noted that arrangement of the second electrode 10 is not limited to this and that any known electrode arrangement, such as an arrangement using a pseudo vertical structure, can be preferably used.

It is preferable that contact between the second electrode 10 and the diamond semiconductor layer be ohmic. For example, since an electrode including titanium (Ti)/platinum (Pt)/gold (Au) deposited by an electron beam and heat-treated in argon (Ar) gas atmosphere is a good ohmic electrode to the diamond semiconductor layer, the electrode can be preferably used as the second electrode 10.

Regardless of the conduction type, i.e. the n-type or the p-type, on the oxygen-terminated surface of the diamond semiconductor layer, a Fermi level is firmly pinned on an interface with the same metal disposed on the diamond semiconductor layer.

Accordingly, in the semiconductor device 100 of the present embodiment, by using the same metal for the first electrode 18, good Schottky junctions can be formed with the p-type second diamond semiconductor layer 14 and with the n-type third diamond semiconductor layers 16.

In the n-type diamond semiconductor layer, on the interface with the first electrode 18, the Fermi level is pinned at a level of 4.3 eV from a conduction band. Accordingly, since a Schottky barrier is high, the n-type diamond semiconductor layers are depleted due to application of a forward bias. Further, electrons hardly move from the first electrode 18 to the n-type third diamond semiconductor layers 16. Accordingly, the holes injected from the p-type second diamond semiconductor layer 14 to the n-type third diamond semiconductor layers 16 hardly disappear due to recombination with the electrons until the holes reach the first electrode 18.

Further, a valence band of the n-type third diamond semiconductor layers 16 is bent on the interface with the first electrode 18 so as to reduce the barrier for the holes. Accordingly, in the semiconductor device 100 of the present embodiment, since resistance for the holes becomes small and large on-current flows at low bias voltage, low on-resistance can be realized.

Further, a part where the n-type third diamond semiconductor layers 16 are not disposed and the p-type second diamond semiconductor layer 14 and the first electrode 18 are in contact with each other is a p-type Schottky diode. Accordingly, in the semiconductor device 100 of the present embodiment as a whole, large on-current flows at low bias voltage and low on-resistance can be realized. It should be noted that the semiconductor device 100 of the present embodiment is a unipolar device where the holes contribute to conduction.

If a reverse bias is applied, a depletion layer generated in the p-type second diamond semiconductor layer 14 extends to the adjacent n-type third diamond semiconductor layers 16. Accordingly, an electric field on the Schottky junction interface is relaxed, and increase in breakdown voltage of the semiconductor device 100 can be realized.

In the diamond semiconductor, it is difficult to perform impurity doping by ion injection or solid phase diffusion. Accordingly, in formation of the diamond semiconductor layer, the doping is usually performed when the diamond semiconductor layers are formed.

It is particularly difficult to perform the n-type impurity doping into the diamond semiconductor. Here, efficiency of taking the n-type impurity into the diamond semiconductor is different depending on the plane orientation of the taken-into diamond semiconductor. For example, in a case where the n-type impurity is phosphorus (P), if a {111} plane is formed on a substrate having a plane orientation of {111} in a <111> direction, efficiency of taking the phosphorus (P) is approximately 0.02%.

On the other hand, if the {110} plane is formed on a substrate having the plane orientation of {110} in a <110> direction, efficiency of taking the phosphorus (P) is approximately 0.0002%.

Thus, if the n-type diamond semiconductor is formed to efficiently dope the n-type impurity into the diamond semiconductor, it is preferable that the {111} plane be formed in the <111> direction. At this time, it is preferable that an a parameter be adjusted by controlling a ratio between methane ($CH_4$) gas and hydrogen ($H_2$) gas.

In the present embodiment, the surface 20 of the second diamond semiconductor layer has the plane orientation within ±10 degrees from the {100} plane, the side surface 22 of the third diamond semiconductor layer has the plane orientation within ±10 degrees from the {110} plane, and a bottom surface 24 of the second diamond semiconductor layer has the plane orientation within ±10 degrees from the {100} plane. With this configuration, since the direction, at which the third diamond semiconductor layers 16 are formed, is close to the <111> direction, the third diamond semiconductor layers 16 can be formed while efficiently taking the n-type impurity.

A method of manufacturing the semiconductor device of the present embodiment will be described below.

The method of manufacturing the semiconductor device of the present embodiment includes: forming a p-type second diamond semiconductor layer on a p-type first diamond semiconductor layer by epitaxial growth, the p-type second diamond semiconductor layer having a p-type impurity concentration lower than a p-type impurity concentration of the first diamond semiconductor layer; forming grooves on the second diamond semiconductor layer; forming a plurality of n-type third diamond semiconductor layers within the grooves by epitaxial growth; forming a second electrode electrically connected to the first diamond semiconductor layer; oxygen-terminating surfaces of the n-type second diamond semiconductor layer and surfaces of the third diamond semiconductor layers; and forming a first electrode on the second diamond semiconductor and the third diamond semiconductor layers, the first electrode forming first junctions between the first electrode and the second diamond semiconductor, the first electrode forming second junctions between the first electrode and the third diamond semiconductor layers, the first junctions and the second junctions being Schottky junctions.

FIGS. 2A to 2F are schematic diagrams illustrating the method of manufacturing the semiconductor device 100 of the present embodiment.

Figure 2A:
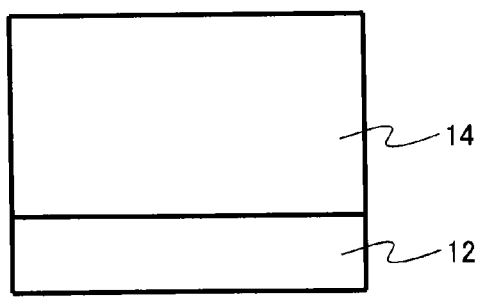
FIGS. 2A to 2F are schematic diagrams illustrating a method of manufacturing the semiconductor device of the first embodiment.

First, as illustrated in the schematic cross-sectional view of FIG. 2A, the second diamond semiconductor layer 14 is formed on the first diamond semiconductor layer 12 by epitaxial growth. Here, it is preferable to use, for example, microwave plasma CVD (chemical vapor deposition) for the epitaxial growth in the manufacturing method of the present embodiment.

It is preferable that a principal surface of the first diamond semiconductor layer 12 and the surface 20 of the second diamond semiconductor layer have the plane orientations within ±10 degrees from the {100} plane. Further, it is preferable to use, for example, hydrogen ($H_2$) gas and methane ($CH_4$) gas as source gas for forming the p-type diamond semiconductor layer in the present embodiment, and diborane ($B_2H_6$) gas as p-type impurity gas.

Figure 2D:
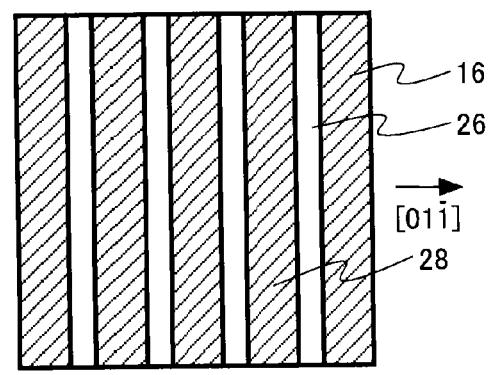
Figure 2B:
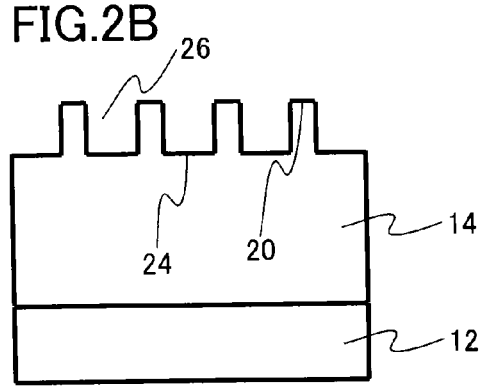

Next, as illustrated in the schematic cross-sectional view of FIG. 2B, a plurality of grooves 26 is formed on the second diamond semiconductor layer 14 by, for example, a photolithography method and an RIE (reactive ion etching) method. Here, it is preferable that the bottom surface 24 of the second diamond semiconductor layer have the plane orientation within ±10 degrees from the {100} plane.

Figure 2E:
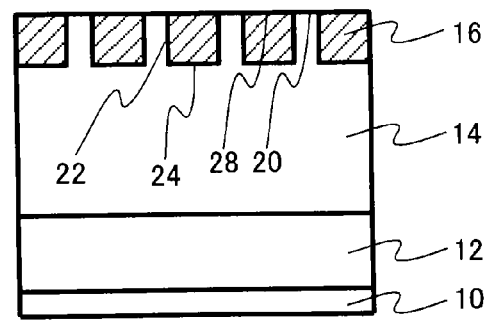
Figure 2C:
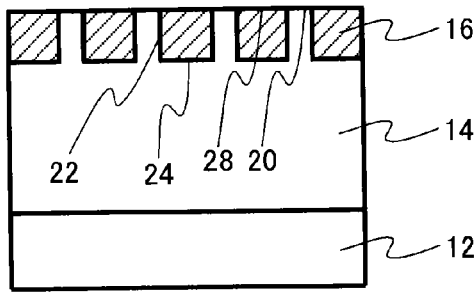
Figure 2F:
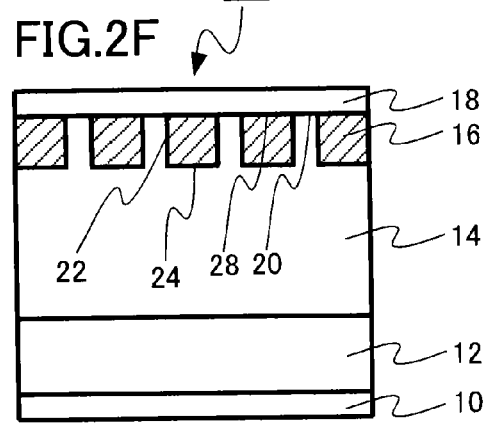

Next, as illustrated in the schematic cross-sectional view of FIG. 2C, the plurality of n-type third diamond semiconductor layers 16 is formed within the grooves 26 by, for example, a microwave plasma CVD. Here, it is preferable that the side surfaces 22 of the n-type third diamond semiconductor layers have the plane orientations within ±10 degrees from the {110} plane.

It is preferable to use, for example, hydrogen ($H_2$) gas and methane ($CH_4$) gas as source gas for forming the n-type diamond semiconductor layers in the present embodiment, and phosphine ($PH_3$) gas as n-type impurity gas. It is preferable that the n-type diamond semiconductor layer with the properly controlled impurity concentration be formed by appropriately selecting a ratio among the $H_2$ gas, the $CH_4$ gas, and the n-type impurity. Particularly, it is preferable that the α parameter be adjusted by controlling the ratio between the $CH_4$ gas and the $H_2$ gas and that the n-type third diamond semiconductor layers 16 be formed in the <111> direction.

FIG. 2D is a schematic diagram of the semiconductor device illustrated in the schematic cross-sectional view of FIG. 2C, as viewed from above the paper surface. If the surface 20 of the second diamond semiconductor layer has the plane orientation of the {100} plane, a direction vertical to the surface 20 of the second diamond semiconductor layer, of the semiconductor device illustrated in FIG. 2D, i.e., a direction vertical to the paper surface, is a <100> direction.

If the side surfaces 22 of the n-type third diamond semiconductor layers have the plane orientations of the plane, a direction vertical to the side surfaces 22 of the n-type third diamond semiconductor layers, of the semiconductor device illustrated in FIG. 2D, i.e., a right direction of the paper surface, is a [01-1] direction or the <110> direction. Further, an upper direction of the paper surface is a [011] direction or the <110> direction.

Next, as illustrated in the schematic cross-sectional view of FIG. 2E, the second electrode 10 electrically connected to the first diamond semiconductor layer 12 is formed on the surface of the first diamond semiconductor layer 12 on the side opposite to the surface, on which the second diamond semiconductor layer 14 is disposed. Here, formation of the second electrode 10 is carried out by depositing, for example, titanium (Ti)/platinum (Pt)/gold (Au) by electron beam deposition and then, by heat-treating in the Ar (argon) gas atmosphere at a temperature of 600° C. for 10 minutes.

Next, the surfaces 20 of the second diamond semiconductor layer and the surfaces 28 of the third diamond semiconductor layers are oxygen-terminated. Here, a known method, such as an oxygen plasma ashing treatment, can be preferably used for the oxygen termination.

Next, the first electrode 18 is formed on the second diamond semiconductor layer 14 and on the third diamond semiconductor layers 16. Since the surfaces 20 of the second diamond semiconductor layer and the surfaces 28 of the third diamond semiconductor layers are oxygen-terminated, the good Schottky junctions are formed with the first electrode 18. Here, it is preferable to use, for example, laser beam deposition for formation of the first electrode 18.

According to the semiconductor device 100 of the present embodiment, the semiconductor device 100 with ultrahigh breakdown voltage and low on-resistance and the method of manufacturing the same can be provided by having the above-described configuration.

Second Embodiment

A semiconductor device of the present embodiment is the same as that of the first embodiment except that a shape of a plurality of n-type third diamond semiconductor layers 16 is different from that of the plurality of n-type third diamond semiconductor layers 16 in the first embodiment. Descriptions of points overlapping with the semiconductor device of the first embodiment are omitted.

Figure 3A:
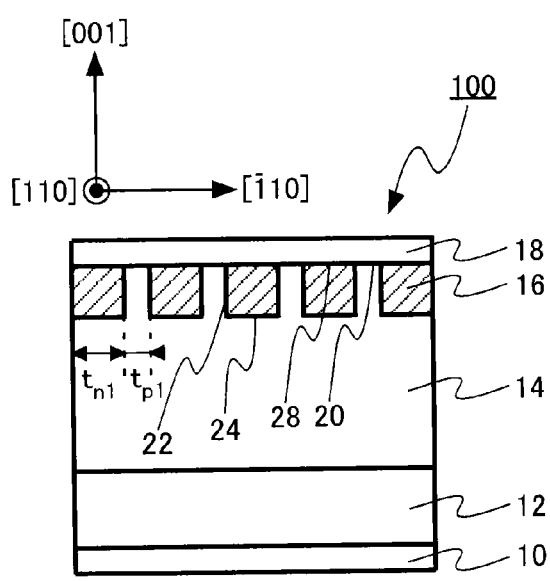
FIGS. 3A and 3B are schematic cross-sectional views of a semiconductor device of a second embodiment.
Figure 3B:
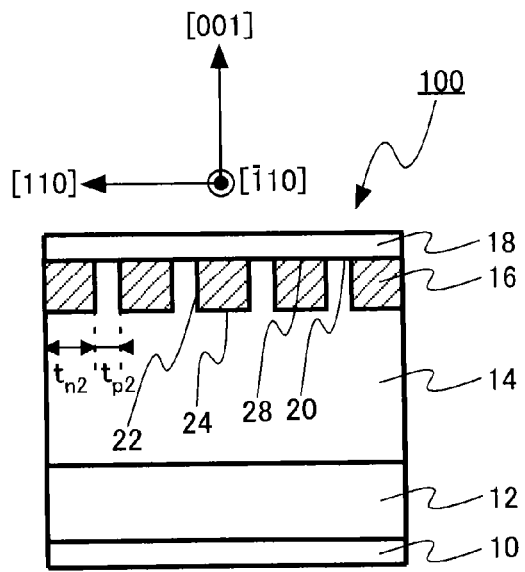

FIGS. 3A and 3B are schematic cross-sectional views of a semiconductor device 100 of the present embodiment.

As illustrated in FIG. 3B, in the semiconductor device 100 of the present embodiment, the number per unit length of side surfaces 22 of the n-type third diamond semiconductor layers 16 in the [110] direction is larger than the number of side surfaces 22 of the semiconductor device 100 in the first embodiment. With this configuration, the number of {111} planes or planes having plane orientations closer to {111} formed in a process of forming the n-type third diamond semiconductor layers 16 is increased. Therefore, the third diamond semiconductor layers 16 can be formed in a shorter time.

According to the semiconductor device 100 of the present embodiment, the semiconductor device 100 with ultrahigh breakdown voltage and low on-resistance which can be manufactured in a shorter time and the method of manufacturing the same can be provided by having the above-described configuration.

EXAMPLES

Examples will be described below.

Example 1

The semiconductor device 100 with the structure of the first embodiment was manufactured.

First, $H_2$ gas, $CH_4$ gas, and $B_2H_6$ gas were supplied onto the p-type first diamond semiconductor layer 12, and the p-type second diamond semiconductor layer 14 was formed by the microwave plasma CVD. Here, the plane orientations of the principal surface of the p-type first diamond semiconductor layer 12 and the surface 20 of the p-type second diamond semiconductor layer were the {100} planes.

Next, the plurality of grooves 26 was formed on the second diamond semiconductor layer 14 by the photolithography method and the RIE method. Here, the plane orientation of the bottom surface 24 of the second diamond semiconductor layer was the {100} plane. The plane orientation of the side surface of the groove 26 was the {110} plane. Further, $t_{n1}$ and $t_{p1}$ were 2 μm and 4 μm, respectively. Moreover, the depth of the groove 26 was 0.5 μm.

Next, $CH_4$ gas, $H_2$ gas, and $PH_3$ gas were supplied, and the plurality of n-type third diamond semiconductor layers 16 was formed within the grooves 26. At this time, the α parameter was adjusted by controlling the ratio between the $CH_4$ gas and the $H_2$ gas, and the n-type third diamond semiconductor layers 16 were formed in the <111> direction. The plane orientations of the side surfaces 22 of the n-type third diamond semiconductor layers were the {110} planes.

As a result of an analysis by SIMS (secondary ion mass spectroscopy), a B concentration in the first diamond semiconductor layer 12 was $5 \times 10^{20}$ atoms/cm$^3$. Further, a B concentration in the second diamond semiconductor layer 14 was $1 \times 10^{15}$ atoms/cm$^3$. Furthermore, a P concentration in the third diamond semiconductor layer was $5 \times 10^{17}$ atoms/cm$^3$.

Next, the second electrode 10 electrically connected to the first diamond semiconductor layer 12 was formed on the surface of the first diamond semiconductor layer 12 on the side opposite to the surface, on which the second diamond semiconductor layer 14 was disposed. Here, formation of the second electrode 10 was carried out by depositing, for example, titanium (Ti)/platinum (Pt)/gold (Au) by the electron beam deposition and then, by heat-treating in the Ar (argon) gas atmosphere at the temperature of 600° C. for 10 minutes.

Next, the surfaces 20 of the second diamond semiconductor layer and the surfaces 28 of the third diamond semiconductor layers were oxygen-terminated by the oxygen plasma ashing.

Next, the first electrode 18 formed of Pt was formed on the surfaces 20 of the second diamond semiconductor layer and the surfaces 28 of the third diamond semiconductor layers by the electron beam deposition.

When I-V characteristics of the manufactured semiconductor device 100 was measured, results that a rectification ratio at ±10 V is ten digits or more and an on-resistance is 0.1 mΩcm$^2$ (3 V) were obtained. Further, even when the reverse bias was applied up to 10 kV, breakdown did not occur.

Example 2

The semiconductor device 100 with the structure of the second embodiment was manufactured.

$t_{n1}$ and $t_{p1}$ were 2 μm and 4 μm, respectively. Further, $t_{n2}$ and $t_{p2}$ were 2 μm and 4 μm, respectively. The other parts were manufactured in the same manner as Example 1.

When I-V characteristics of the manufactured semiconductor device 100 was measured, results that a rectification ratio at ±10 V is ten digits or more and an on-resistance is 0.1 mΩcm$^2$ (3 V) were obtained. Further, even when the reverse bias was applied up to 10 kV, breakdown did not occur.

The semiconductor device of at least one embodiment described above includes: a p-type first diamond semiconductor layer; a p-type second diamond semiconductor layer disposed on the first diamond semiconductor layer, the p-type second diamond semiconductor layer having a p-type impurity concentration lower than a p-type impurity concentration of the first diamond semiconductor layer and having oxygen-terminated surfaces; a plurality of n-type third diamond semiconductor layers disposed on the second diamond semiconductor layer, each having an oxygen-terminated surface; and a first electrode disposed on the second diamond semiconductor and the third diamond semiconductor layers, the first electrode forming first junctions between the first electrode and the second diamond semiconductor, the first electrode forming second junctions between the first electrode and the third diamond semiconductor layers, the first junctions and the second junctions being Schottky junctions. Therefore, the semiconductor device with ultrahigh breakdown voltage and low on-resistance can be provided.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
   a p-type first diamond semiconductor layer;
   a p-type second diamond semiconductor layer disposed on the first diamond semiconductor layer, the p-type second diamond semiconductor layer having a p-type impurity concentration lower than a p-type impurity concentration of the first diamond semiconductor layer and having oxygen-terminated surfaces;
   a plurality of n-type third diamond semiconductor layers disposed on the second diamond semiconductor layer, each having an oxygen-terminated surface; and
   a first electrode disposed on the second diamond semiconductor and the third diamond semiconductor layers, the first electrode forming first junctions between the first electrode and the second diamond semiconductor, the first electrode forming second junctions between the first electrode and the third diamond semiconductor layers, the first junctions and the second junctions being Schottky junctions.

2. The semiconductor device according to claim 1, wherein an n-type impurity in the third diamond semiconductor layers are phosphorus (P), and a concentration of the phosphorus is $1 \times 10^{15}$ atoms/cm$^3$ or more and $5 \times 10^{18}$ atoms/cm$^3$ or less.

3. The semiconductor device according to claim 1, wherein the third diamond semiconductor layers are depleted due to application of a forward bias.

4. The semiconductor device according to claim 1, wherein a surface of the second diamond semiconductor layer has a plane orientation within ±10 degrees from a {100} plane, and side surfaces of the third diamond semiconductor layers have plane orientations within ±10 degrees from a {110} plane.

5. The semiconductor device according to claim 1, wherein the first electrode includes at least one kind of metals selected from a first group consisting of nickel (Ni), aluminum (Al), titanium (Ti), molybdenum (Mo), ruthenium (Ru), tungsten carbide (WC), gold (Au), palladium (Pd), iridium (Ir), platinum (Pt), and rhodium (Rh).

6. The semiconductor device according to claim 1, further comprises a second electrode electrically connected to the first diamond semiconductor layer.

7. A semiconductor device comprising: a p-type first diamond semiconductor layer; a p-type second diamond semiconductor layer disposed on the first diamond semiconductor layer, the p-type second diamond semiconductor layer having a p-type impurity concentration lower than a p-type impurity concentration of the first diamond semiconductor layer and having oxygen-terminated surfaces; a plurality of n-type third diamond semiconductor layers disposed on the second diamond semiconductor layer, each having an oxygen-terminated surface, an n-type impurity in the plurality of n-type third diamond semiconductor layers being phosphorus (P), a phosphorus concentration being $1 \times 10^{15}$ atoms/cm$^3$ or more and $5 \times 10^{18}$ atoms/cm$^3$ or less, the third diamond semiconductor layers being depleted due to application of a forward bias; and a first electrode disposed on the second diamond semiconductor and the third diamond semiconductor layers, the first electrode forming first junctions between the first electrode and the second diamond semiconductor, the second electrode forming second junctions between the first electrode and the third diamond semiconductor layers, the first junctions and the second junctions being Schottky junctions.

8. The semiconductor device according to claim 7, wherein the surface of the second diamond semiconductor layer has a plane orientation within ±10 degrees from a {100} plane, and side surfaces of the third diamond semiconductor layers have plane orientations within ±10 degrees from a {110} plane.

9. The semiconductor device according to claim 7, wherein the first electrode includes at least one kind of metals selected from a first group consisting of nickel (Ni), aluminum (Al), titanium (Ti), molybdenum (Mo), ruthenium (Ru), tungsten carbide (WC), gold (Au), palladium (Pd), iridium (Ir), platinum (Pt), and rhodium (Rh).

10. A method of manufacturing a semiconductor device comprising: forming a p-type second diamond semiconductor layer on a p-type first diamond semiconductor layer by epitaxial growth, the p-type second diamond semiconductor layer having a p-type impurity concentration lower than a p-type impurity concentration of the first diamond semiconductor layer; forming grooves on the second diamond semiconductor layer; forming a plurality of n-type third diamond semiconductor layers within the grooves by epitaxial growth; forming a second electrode electrically connected to the first diamond semiconductor layer; forming oxygen-terminating surfaces for the second diamond semiconductor layer and for surfaces of the n-type third diamond semiconductor layers; and forming a first electrode on the second diamond semiconductor and the third diamond semiconductor layers, the first electrode forming first junctions between the first electrode and the second diamond semiconductor, the first electrode forming second junctions between the first electrode and the third diamond semiconductor layers, the first junctions and the second junctions being Schottky junctions.

* * * * *